(12) United States Patent
Kaskoun et al.

(10) Patent No.: US 8,080,862 B2
(45) Date of Patent: Dec. 20, 2011

(54) SYSTEMS AND METHODS FOR ENABLING ESD PROTECTION ON 3-D STACKED DEVICES

(75) Inventors: Kenneth Kaskoun, San Diego, CA (US); Shiqun Gu, San Diego, CA (US); Matthew Nowak, San Diego, CA (US)

(73) Assignee: QUALCOMM Incorporate, San Diego, CA (US)

( * ) Notice: Subject to any disclaimer, the term of this patent is extended or adjusted under 35 U.S.C. 154(b) by 369 days.

(21) Appl. No.: 12/206,914

(22) Filed: Sep. 9, 2008

(65) Prior Publication Data

US 2010/0059869 A1    Mar. 11, 2010

(51) Int. Cl.
*H01L 23/58* (2006.01)
(52) U.S. Cl. ............. 257/594; 257/E23.174; 438/455
(58) Field of Classification Search .......... 257/665, 257/621, 594, E23.174; 438/455
See application file for complete search history.

(56) References Cited

U.S. PATENT DOCUMENTS

| | | | | |
|---|---|---|---|---|
| 3,576,549 | A * | 4/1971 | Hess et al. | 365/72 |
| 5,703,747 | A | 12/1997 | Voldman | |
| 5,807,791 | A | 9/1998 | Bertin | |
| 7,061,066 | B2 * | 6/2006 | Kocon | 257/476 |
| 2002/0115260 | A1 | 8/2002 | Halahan | |
| 2006/0001174 | A1 | 1/2006 | Matsui | |
| 2007/0029646 | A1 | 2/2007 | Voldman | |

OTHER PUBLICATIONS

International Search Report-PCT/US2009/055620, International Search Authority-European Patent Office Nov. 30, 2009.
Written Opinion-PCT/US2009/055620, International Search Authority-European Patent Office Nov. 30, 2009.

* cited by examiner

*Primary Examiner* — Kiesha Bryant
*Assistant Examiner* — Tucker Wright
(74) *Attorney, Agent, or Firm* — Michelle Gallardo; Sam Talpalatsky; Jonathan T. Velasco

(57) ABSTRACT

An electrostatic discharge (ESD) protection device is fabricated in a vertical space between active layers of stacked semiconductor dies thereby utilizing space that would otherwise be used only for communication purposes. The vertical surface area of the through silicon vias (TSVs) is used for absorbing large voltages resulting from ESD events. In one embodiment, an ESD diode is created in a vertical TSV between active layers of the semiconductor dies of a stacked device. This ESD diode can be shared by circuitry on both semiconductor dies of the stack thereby saving space and reducing die area required by ESD protection circuitry.

11 Claims, 6 Drawing Sheets

US 8,080,862 B2

SYSTEMS AND METHODS FOR ENABLING ESD PROTECTION ON 3-D STACKED DEVICES

TECHNICAL FIELD

This disclosure relates generally to electrostatic discharge (ESD) protection for semiconductor devices, and more particularly, to systems and methods for enabling ESD protection in 3-D stacked semiconductor devices.

BACKGROUND

In through silicon stacking (TSS), silicon chips are stacked to form 3-D electronic devices. In such devices, interconnects between the chips are constructed. These interconnects often include through silicon vias (TSVs).

Each circuit on each of the stacked chips requires ESD protection on the circuit's I/O ports. Unfortunately, ESD protection circuitry has a relatively large footprint on the silicon. When existing circuitry is split among multiple chips of a 3-D device, the circuits (and their respective ESD protection) may be separated. Consequently, ESD protection is provided on each chip to protect each portion of the circuit split amongst different chips. As a result, the ESD protection circuitry requires even more space on the 3-D stacked chips.

BRIEF SUMMARY

ESD protection circuitry is constructed in the vertical space (for example, through silicon vias (TSVs)) between active layers on different chips of 3-D stacked devices thereby utilizing space that would otherwise be used only for communication purposes. The vertical surface area of the through silicon vias absorbs large ESD events.

In one embodiment, a semiconductor die includes at least one active circuit within at least one via constructed in a substrate.

In another embodiment, an ESD protection diode is created in the vertical dimension between active layers of stacked dies. This ESD protection diode can be shared by circuitry on both semiconductor dies of the stack thereby saving space and reducing the chip area required by ESD protection circuitry.

In yet another embodiment, a semiconductor die is constructed having at least one through silicon via (TSV). The TSV contains at least one active circuit. The semiconductor die is stacked in a parallel combination with a second semiconductor die, and the TSV is positioned vertically between active layers of the stacked dies.

In yet another embodiment, a method for constructing electrostatic discharge (ESD) protection circuitry includes arranging a stacked semiconductor device such that through silicon vias (TSVs) from one semiconductor die of the device are coupled to an adjacent semiconductor die. Using this arrangement, I/O pads from at least one of the semiconductor dies can be coupled to electrostatic discharge (ESD) protection circuitry constructed at least partially within at least one of the TSVs.

In still another embodiment, a stacked semiconductor device includes first and second semiconductor dies positioned in parallel relationship to each other. The device also includes means for coupling active layers of the positioned dies. The coupling means includes active elements.

The foregoing has outlined rather broadly the features and technical advantages of the present invention in order that the detailed description that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings.

DETAILED DESCRIPTION

Figure 1A:
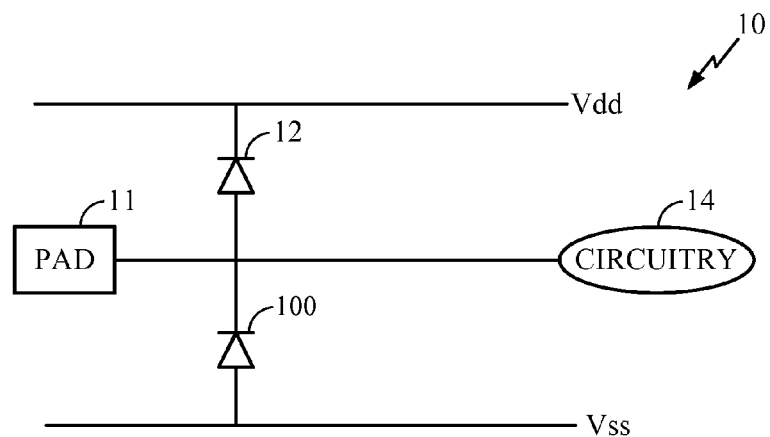
FIGS. 1A and 1B illustrate conventional ESD protection circuitry.
Figure 1B:
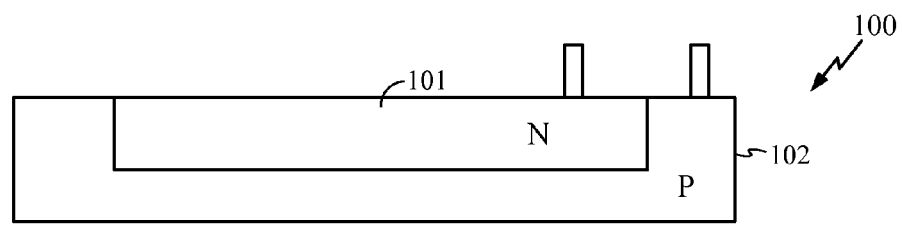

FIGS. 1A and 1B illustrate conventional ESD protection circuitry. FIG. 1A shows a portion of a device 10 in which an I/O pad 11 accepts a high voltage or a high current discharge, such as could occur with an ESD event. In order to protect the circuitry 14 from negative effects of an ESD event, a surge diode 12 discharges the excess voltage to Vdd. In some cases, for example when a negative high voltage (or current) event occurs, a diode 100 discharges the excess voltage to Vss or ground. Typically the diodes 12, 100 are quite large.

FIG. 1B shows a typical diode structure 100 having a P section 102 and an N section 101. These diode structures 100 are large in order to handle the relatively large voltages involved with ESD events. One of these diodes is generally associated with every I/O pad.

Figure 2A:
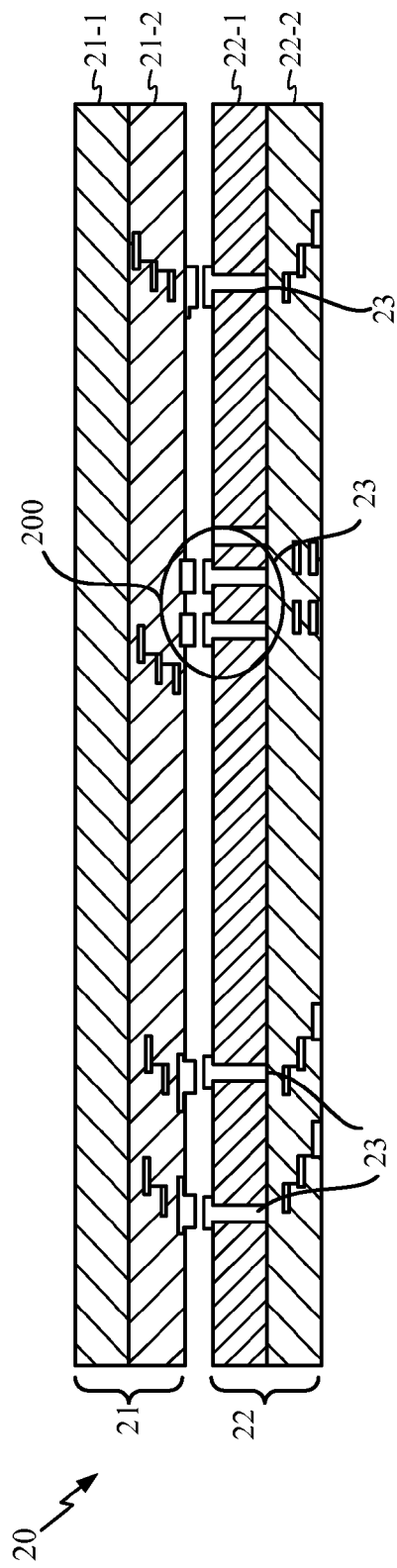
FIGS. 2A and 2B are cross section views showing one embodiment.
Figure 2B:
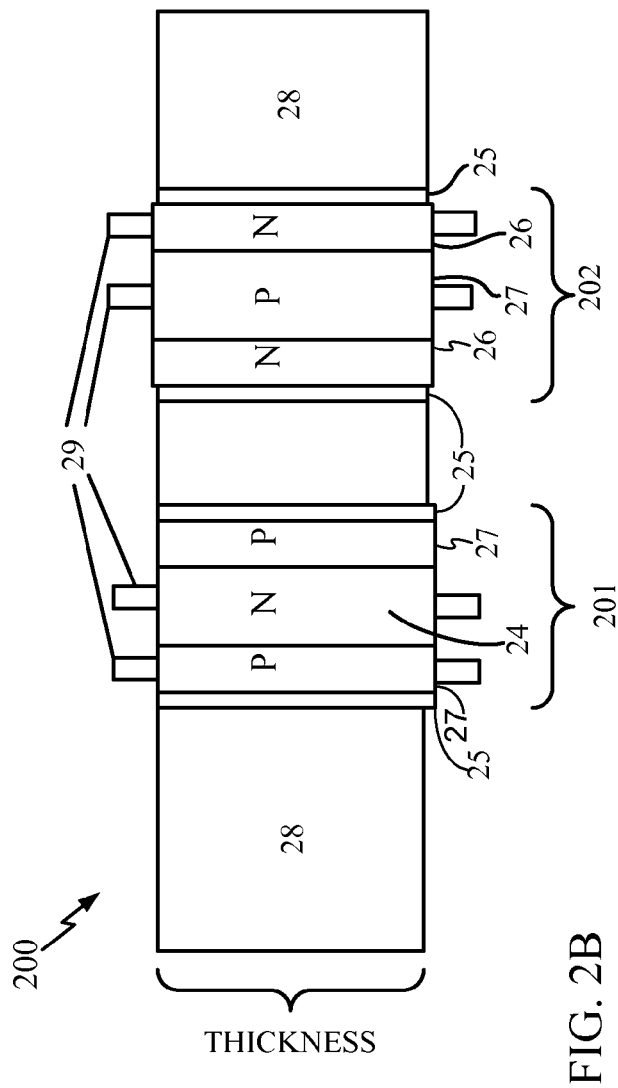

FIGS. 2A and 2B show one embodiment of the present disclosure. FIG. 2A shows a device 20 having dies 21 and 22 in a stacked parallel relationship with each other, and having an ESD protection device 200. The top die 21 has its backing layer 21-1 positioned on top of its face (active layer) layer 21-2. The bottom die 22 is positioned in the same orientation with its backing layer 22-1 on top of its face (active layer) layer 22-2. Note that each die can have any desired orientation and the concepts taught herein can still be applied.

Through silicon vias (TSVs) 23 are constructed in the backing layer 22-1 between the active surfaces 21-2, 22-2 of the dies 21, 22 to carry inter-die communication, as desired. One or more of these vias 23 are constructed as a vertical ESD protection device, such as device 200, having one or more diodes. In this context, vertical means perpendicular to the plane of the dies the ESD protection device 200 is designed to protect. The vertical ESD protection device 200 can be constructed fully on one chip, or partially on each chip of two adjacent stacked chips. Also, the vertical device 200 need not be exactly perpendicular to the longitudinal area of the chips 21, 22 but could be slanted, or even partially parallel to the stacked chips 21, 22 in the area.

FIG. 2B illustrates one such vertically constructed device 200 having a pair of diodes 201 and 202. The diode 201 is shown having P-material 27 surrounding N-material 24 and the diode 202 is shown having N-material 26 surrounding P-material 27. An insulator 25 separates each diode 201, 202 from the semiconductor substrate 28. Electrode connections 29 are shown to enable access to the N and P sections. Note that while diodes are being discussed in this embodiment, transistors or other active elements could be constructed as desired.

The thickness of the silicon forming these diodes 201, 202, in one embodiment, is between 20 and 100 micro-meters, thereby making the diodes 201, 202 relatively large, and able to withstand the voltages of electrostatic discharge (ESD) events. The effective diode area is increased by using the surface area around the circumference of the via, which may be substantially cylindrically shaped, in one embodiment. In other words, using 3-D construction, rather than standard 2-D diode construction increases the overall active area while using the same amount of chip 'real estate'. Note that when the dies 21, 22 are stacked, as shown in FIG. 2A, both dies 21, 22 can share a common set of ESD diodes 201, 202. Also, one diode can be constructed on one chip while the other diode, (or other portions of one or more diodes) could be constructed on the other chip.

FIGS. 3A through 3G show embodiments of a process for constructing the diodes within the through silicon vias (TSVs) with respect to the embodiments shown in FIGS. 2A and 2B.

Figure 3A:
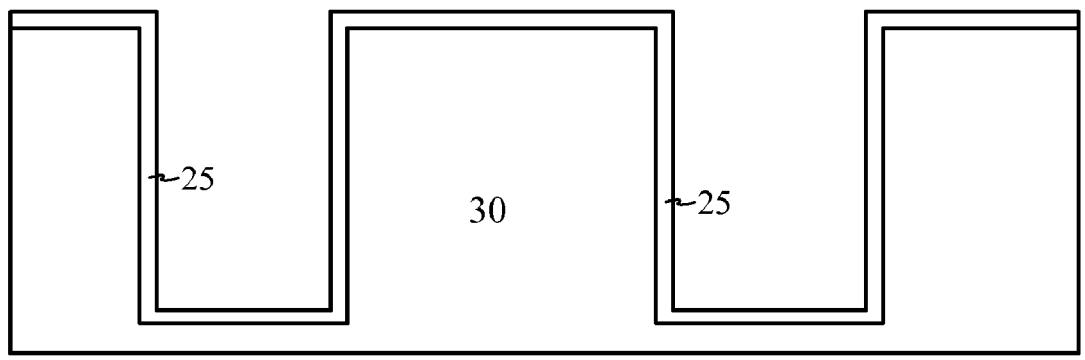
FIGS. 3A through 3G are cross section views showing embodiments of a process for constructing the device shown in FIGS. 2A and 2B.

FIG. 3A shows a via constructed by etching. Then, the insulator material 25 is deposited over the silicon 30 (or other semiconductor material).

Figure 3B:
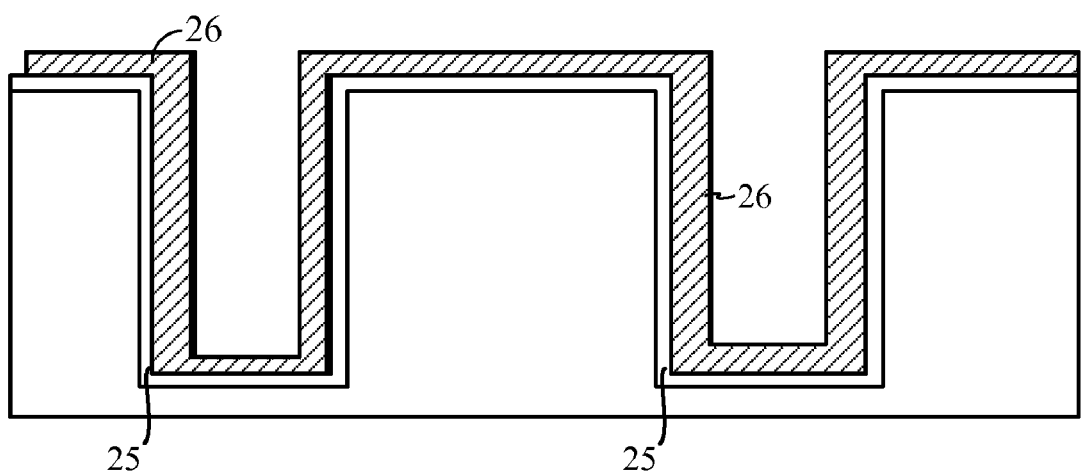

FIG. 3B shows the N-material 26 deposited into both diode spaces, on top of the insulator material 25.

Figure 3C:
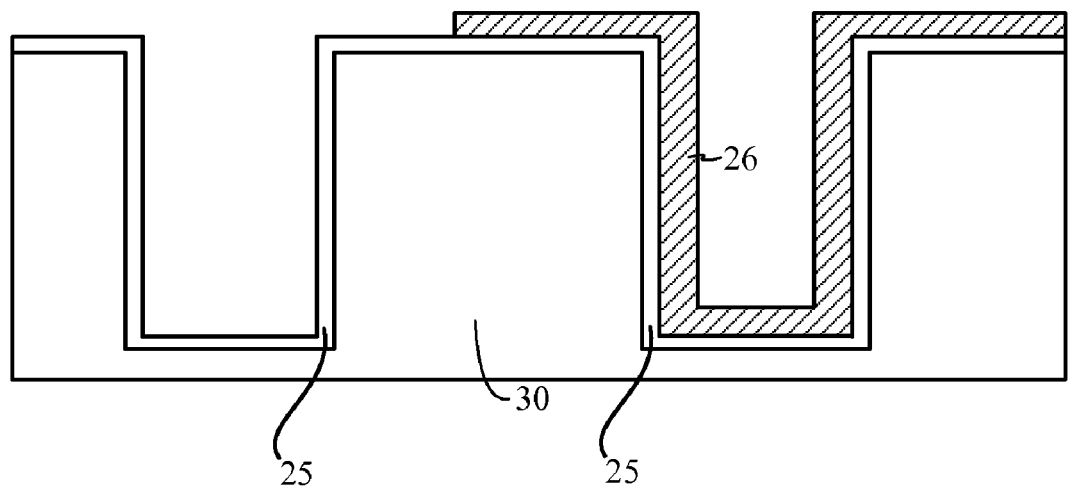

FIG. 3C shows the N-material 26 selectively etched away (in this example) from the left diode or space. N-material 26 remains within the right diode space.

Figure 3D:
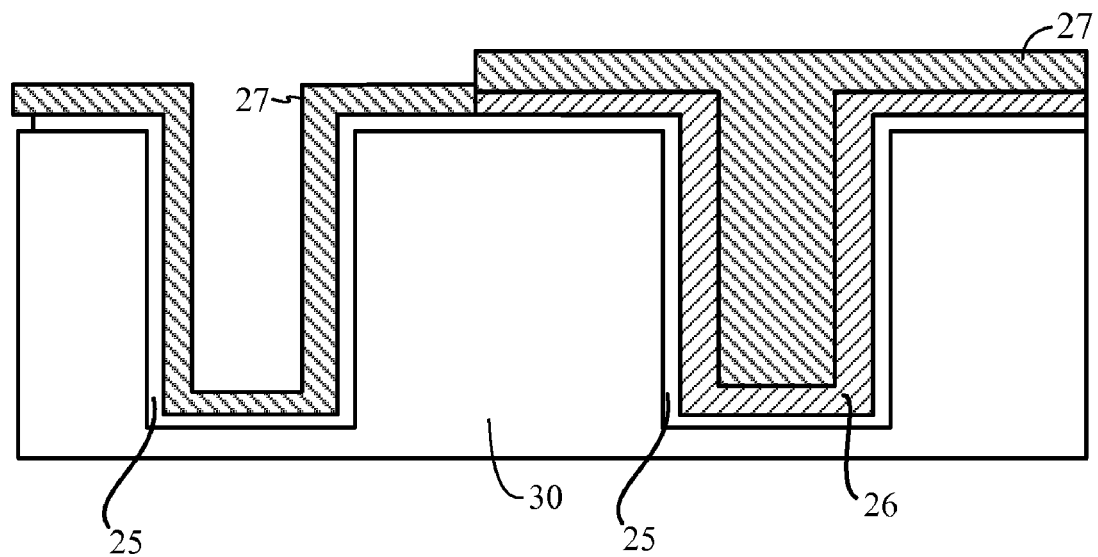

FIG. 3D shows the P-material 27 deposited within the left diode space and the P-material 27 also deposited within the right diode space.

Figure 3E:
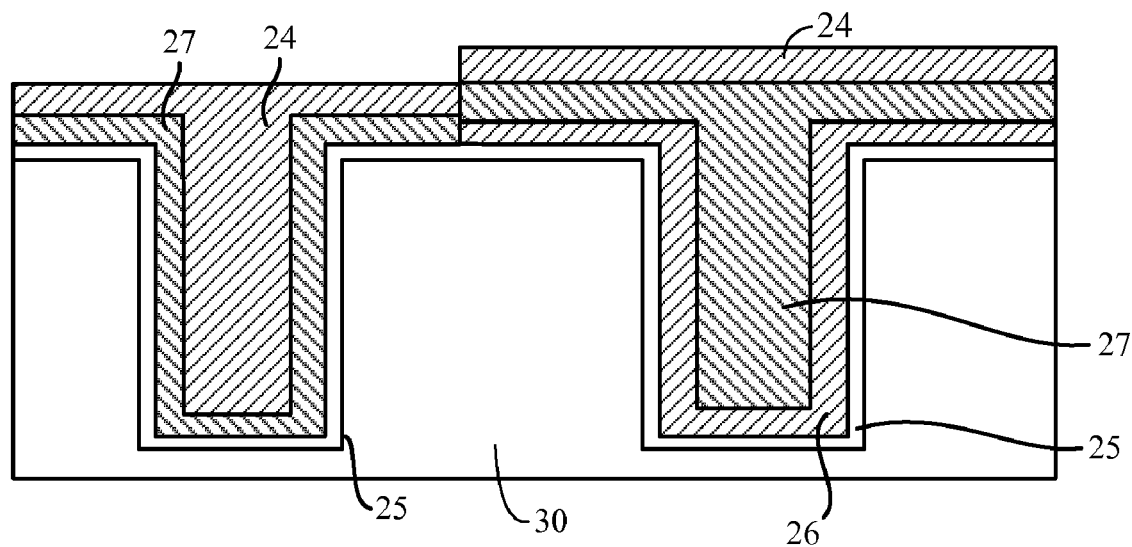

FIG. 3E shows the N-material 24 is deposited within both the left and right diodes spaces.

Figure 3F:
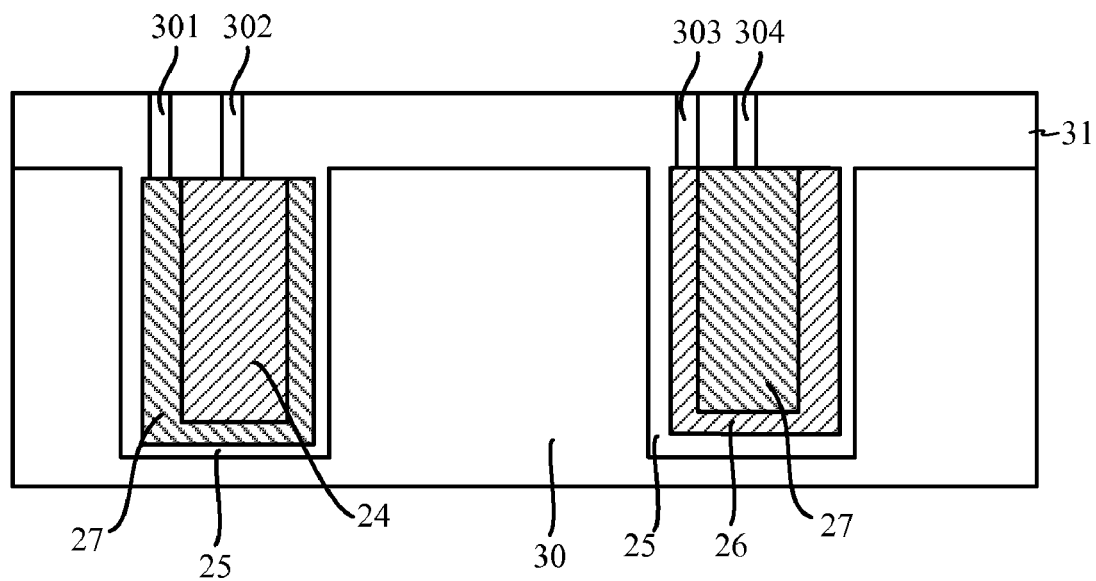

FIG. 3F shows excess material polished or otherwise removed to yield PN and NP diodes. In another embodiment, NP and PN transistors (or other active elements) are created in the "diode spaces," instead of the NP and PN diodes described above.

Normal circuitry of an active layer 31 can then be fabricated in a well known manner. An oxide deposition (not shown) insulates the fabricated circuitry. Contacts 301, 302, 303 and 304 can then be formed so the diodes are accessible. These contacts can be formed in many ways and if desired can be wires, pads or combinations thereof. For example, the pads 302, 303 can be I/O pads, the contact 301 can couple to Vdd and the contact 304 can couple to Vss, as seen in FIG. 4.

According to an embodiment, the area of the PN or NP diodes is sufficient to safely handle (dissipate) electrostatic discharges. These discharges can be on the order of 100 volts to several thousand volts.

Figure 3G:
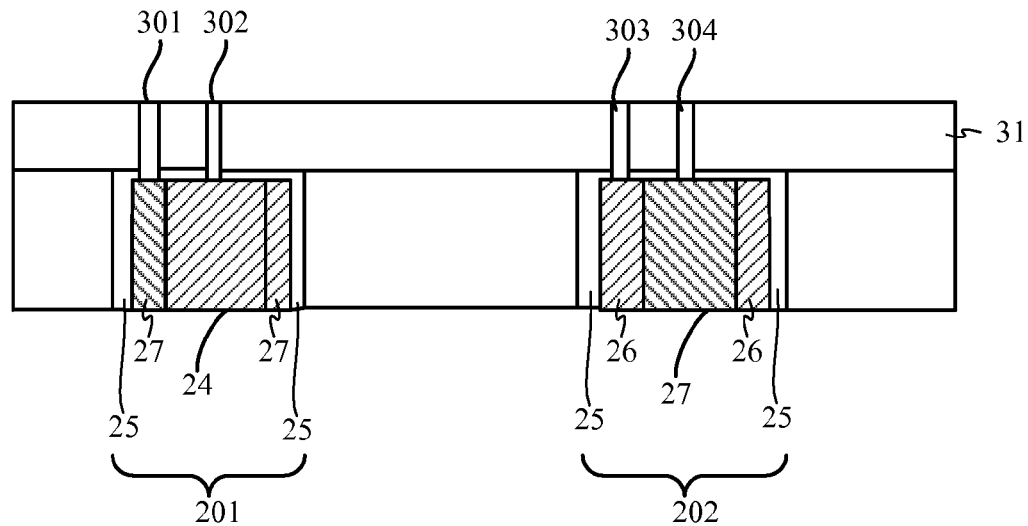

FIG. 3G shows the TSVs exposed from the back (bottom) by back grinding. An insulating layer (not shown) is then deposited and a via is etched so that connections to the back side of the diodes are possible using die to die connections 405 (FIG. 4). Using this back side connection, normal circuitry on the active layer of another stacked die 400 (FIG. 4) can couple to the TSVs and benefit from ESD protection on another die. In another embodiment, the connection from the back side enables the diodes to be coupled to a ground. This embodiment can be useful when analog circuitry exists in the 3-D device and noise impact should be reduced.

Figure 4:
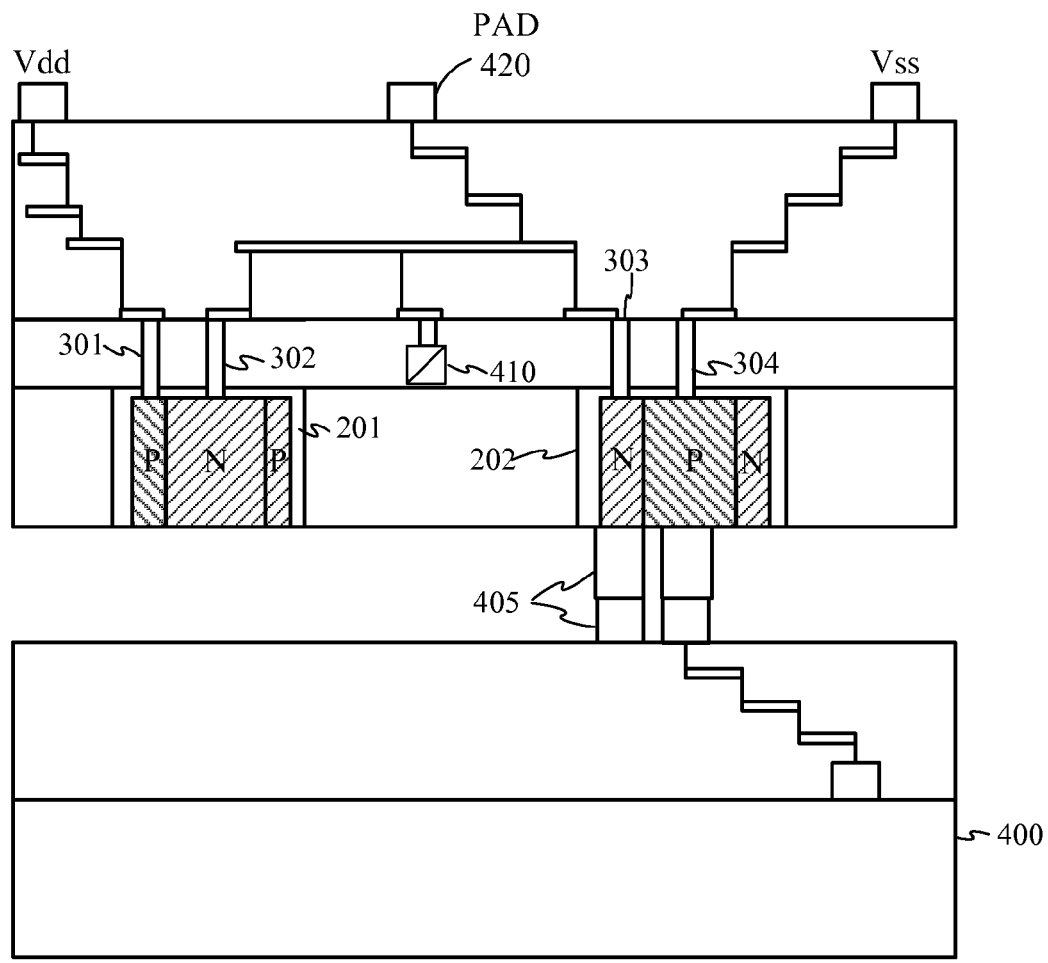
FIG. 4 is a cross section view showing yet another embodiment.

Referring to FIG. 4, protection of an internal circuit 410 by diodes 201, 202 within vias is now explained. The internal circuit 410 receives signals from the PAD 420. If the voltage of the received signal is too low, the right side diode 201 connected to Vss turns on and current will flow from the PAD 420 to Vss. If the voltage is too high, the diode 202 turns on and the current flows from the PAD 420 to Vdd. If the voltage is acceptable (e.g., no ESD event has occurred), the internal circuit 410 receives the signal from the PAD 420.

Note that the processes illustrated are typical processes in semiconductor fabrication and any well-known technique can be used to form the ESD protection device in a vertical direction between active layers of a semiconductor device. Also note that while the discussion herein has focused on ESD protection devices being constructed in the vias, other device types can also be so constructed. Power management devices and circuitry are but one of the types of devices that can be constructed using the teachings of this disclosure. Further note that in some situations a portion of the active device can be constructed on the die in which the via is constructed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A 3-D (three dimensional) stacked integrated circuit device comprising:
   first and second semiconductor dies stacked relative to each other and integrated into a single circuit device;
   a plurality of through vias, each constructed to extend substantially between active layers of the first and second semiconductor dies and configured to provide communication between the first and second semiconductor dies; and
   active circuitry constructed at least partially within the at least one of the plurality of through via vias, the first and second semiconductors dies sharing use of the active circuitry.

2. The device of claim 1 wherein the active circuitry comprises semiconductor devices.

3. The device of claim 1 wherein the active circuitry comprises at least one electrostatic discharge (ESD) protection device.

4. The device of claim 1 wherein the active circuitry comprises P/N junction devices.

5. The device of claim 1 wherein the active circuitry is constructed in both of the semiconductor dies.

6. A method for constructing a 3-D (three dimensional) stacked integrated circuit device, the method comprising:
   stacking a first semiconductor die relative to a second semiconductor die, and integrating the first and second semiconductor dies into a single circuit device;
   fabricating a plurality of through vias substantially between active layers of the first and second semiconductor dies, the plurality of vias being configured to provide communication between the first and second semiconductor dies; and
   constructing active circuitry at least partially within at least one of the plurality of through vias, and the first and second semiconductors dies sharing use of the active circuitry.

7. The method of claim 6 in which the active circuitry comprise P/N junction devices.

8. The method of claim 6 wherein the active circuit comprises: an electrostatic discharge (ESD) protection circuit.

9. The method of claim 8 wherein the ESD protection circuit comprises a diode.

10. A method for electrostatic discharge protection in 3-D (three dimensional) stacked semiconductor devices, the method comprising:
    stacking a first semiconductor die relative to a second semiconductor die, and integrating the first and second semiconductor dies into a single circuit;
    coupling through vias from a portion of the first semiconductor die of the semiconductor device to a portion of the second semiconductor die, the coupling comprising:
    coupling I/O pads from at least one of the first and second semiconductor dies to electrostatic discharge (ESD) protection circuitry constructed at least partially within at least one of the through vias, the first and second semiconductor dies sharing use of the ESD protection circuitry.

11. The method of claim 10 wherein the ESD protection circuitry comprises: a diode.

* * * * *